United States Patent
Kim et al.

(10) Patent No.: US 8,611,117 B2
(45) Date of Patent: Dec. 17, 2013

(54) SOLAR ENERGY GENERATION SYSTEM TRACKING ADAPTIVE MAXIMUM POWER POINT AND ITS METHOD

(75) Inventors: Kyoung Hwan Kim, Gyeonggi-do (KR); Young Sang Bae, Seoul (KR); Seong Jin Oh, Seoul (KR)

(73) Assignee: Kaco New Energy Inc., Gyeonggi-do (KR)

( * ) Notice: Subject to any disclaimer, the term of this patent is extended or adjusted under 35 U.S.C. 154(b) by 140 days.

(21) Appl. No.: 13/279,000

(22) Filed: Oct. 21, 2011

(65) Prior Publication Data

US 2013/0077366 A1    Mar. 28, 2013

(30) Foreign Application Priority Data

Sep. 22, 2011  (KR) .................. 10-2011-0095697

(51) Int. Cl.
  *H02M 5/42*  (2006.01)
(52) U.S. Cl.
  USPC ............................................ 363/95; 323/906
(58) Field of Classification Search
  USPC ............. 363/95, 97, 98, 131, 132; 323/906
  See application file for complete search history.

(56) References Cited

U.S. PATENT DOCUMENTS

| | | | |
|---|---|---|---|
| 5,869,956 A * | 2/1999 | Nagao et al. ................. | 323/299 |
| 5,892,354 A * | 4/1999 | Nagao et al. ................. | 323/299 |
| 6,046,919 A * | 4/2000 | Madenokouji et al. ......... | 363/98 |
| 7,126,294 B2 * | 10/2006 | Minami et al. ................ | 318/139 |
| 7,248,946 B2 * | 7/2007 | Bashaw et al. ............... | 700/286 |
| 2011/0298288 A1 * | 12/2011 | Cho et al. ...................... | 307/70 |
| 2012/0230066 A1 * | 9/2012 | Lai et al. ....................... | 363/37 |
| 2012/0296584 A1 * | 11/2012 | Itoh ............................... | 702/58 |

FOREIGN PATENT DOCUMENTS

JP    06-332553 A    12/1994

* cited by examiner

*Primary Examiner* — Adolf Berhane
(74) *Attorney, Agent, or Firm* — Rabin & Berdo, P.C.

(57) ABSTRACT

Provided are a solar energy generation system having an adaptive maximum power point tracking function and a method thereof. The solar energy generation system includes: a minimum maintenance voltage determination unit configured to output a minimum maintenance voltage which enables the inverter to maintain an operation thereof corresponding to a grid voltage of the grid; a maximum power point tracking controller configured to determine a maximum power point tracking voltage at a maximum power point of the photovoltaic module, using the minimum maintenance voltage and an output voltage and output current of the photovoltaic module, and to output a reference voltage to track the maximum power point; a voltage calculator configured to calculate a difference between the reference voltage and the output voltage of the photovoltaic module; and a voltage adjuster configured to generate a reference current value using an output of the voltage calculator.

4 Claims, 7 Drawing Sheets

SOLAR ENERGY GENERATION SYSTEM TRACKING ADAPTIVE MAXIMUM POWER POINT AND ITS METHOD

CROSS-REFERENCE TO RELATED APPLICATION

The present application claims the benefit under 35 U.S.C. §119(a) to Korean patent application No. 10-2011-0095697, filed on Sep. 22, 2011, the disclosure of which is expressly incorporated by reference herein in its entirety.

BACKGROUND OF THE INVENTION

1. Field of the Invention

The present invention relates to a solar energy generation system, and more particularly, to a solar energy generation system tracking a maximum power point and a method thereof.

2. Description of the Related Art

The output voltage of a photovoltaic module used for solar energy generation varies depending on various environment factors. Of the environment factors, the amount of solar radiation and temperature may be regarded as the biggest factors. Referring to FIGS. 1 and 2, it can be understood in the voltage-power characteristic curve of a photovoltaic module that increasing the voltage increases the power together by a maximum power point, but increasing the voltage over the maximum power point conversely decreases power.

The reason why the photovoltaic module shows the pattern of a voltage-power characteristic curve as described above is that current and voltage in the photovoltaic module has a non-linear relationship. Due to the non-linear relationship of current and voltage in the photovoltaic module, and uncertain environment factors, including the amount of solar radiation and temperature of the photovoltaic module, it is virtually impossible to fix the maximum power point of the photovoltaic module in advance.

For this reason, various algorithms have been developed to control a solar energy generation system to operate on the track of the maximum power point according to the operation of the photovoltaic module. Algorithms which are the most widely used in universal inverters include a Perturb and Observe (P&O) scheme, an incremental conductance scheme, and a constant voltage scheme.

Of these algorithms, the P&O scheme, which is the most widely used, is to perturb the voltage of an inverter and then to determine a maximum power point through a change in the power component depending on the perturbation.

Referring to FIG. 3 which illustrates a voltage-power characteristic curve, in Cases 1 and 2, the power value decreases through adjustment of the voltage value and thus becomes more distant from the maximum power point. Specifically, Case 1 shows that a decrease in the voltage results in a decrease in the power value, and Case 2 shows that an increase in the voltage results in a decrease in the power value.

That is to say, in Cases 1 and 2, since the variations in the voltage result in decreases in the power value, it is possible for the power value to approach the maximum power point by adjusting the output voltage of the inverter in a direction opposite to that in which each corresponding variation in the voltage is made.

In contrast, in Cases 3 and 4, the power value increases through adjustment of the voltage value and thus gets near to the maximum power point. Specifically, Case 3 shows that a decrease in the voltage results in an increase in the power value, and Case 4 shows that an increase in the voltage results in an increases in the power value.

That is to say, in Cases 3 and 4, since the variations in the voltage increase the power value together, it is possible for the power value to further approach the maximum power point by adjusting the output voltage of the inverter in the same direction as that in which each corresponding variation in the voltage is made.

TABLE 1

| Case | ΔP  | ΔV  | Act. |
|------|-----|-----|------|
| 1    | <0  | <0  | +    |
| 2    | <0  | >0  | −    |
| 3    | >0  | <0  | −    |
| 4    | >0  | >0  | +    |

Here, "Act" represents an action which the inverter should take to track the maximum power point, wherein "+" represents increasing the output voltage of the photovoltaic module, and "−" represents decreasing the output voltage of the photovoltaic module.

In the conventional solar energy generation system, an inverter is designed to have the minimum point in the maximum power point (MPP) range in consideration of the allowable maximum value of the grid voltage which is decided in each country. This is because of the principal reason that the minimum value of the output voltage of a photovoltaic module must secure the allowable maximum value of a grid voltage in order to operate a photovoltaic inverter connected with a grid. However, due to a reason on grid operation, some grid voltage may be maintained at a higher level than that of a rated voltage, and in severe cases, may approach the neighborhood of an allowable maximum value. In such a situation, the grid voltage may temporarily exceed the grid voltage by a generation action of a distributed generation system, such as a solar energy generation system.

When the grid voltage exceeds the allowable maximum value while the conventional photovoltaic inverter is operating at the minimum point within the maximum power point range, the operation of the inverter is stopped due to a shortfall in DC voltage. As the inverter is stopped, supplying generation energy to the grid is stopped, so that the grid voltage can return to a value within the allowable range. Since the grid voltage returns to a normal state, the inverter again starts the operation thereof, but the inverter is again stopped due to the problem as described above. Such an abnormal operation in a distributed generation system may cause a problem in the safety of the entire grid including the system.

SUMMARY OF THE INVENTION

Accordingly, the present invention has been made in an effort to solve the problems occurring in the related art, and an object of the present invention is to provide a solar energy generation system having an adaptive maximum power point tracking function, in which the minimum point in the maximum power point rage of an inverter varies depending on the level of a grid voltage, and thus the operation of an inverter can be prevented from stopping, and a method for the system.

Another object of the present invention is to provide a solar energy generation system having an adaptive maximum power point tracking function, in which the inverter tracks the maximum power point at the minimum point in the maximum power point range, wherein although the grid voltage increases over 110% of a raged voltage, it is possible not to stop the operation of the inverter and to supply power provided from a photovoltaic module while only the level of an input voltage increases, and a method for the system.

In order to achieve the above object, according to one aspect of the present invention, there is provided a solar energy generation system which is connected with a grid using an inverter for converting DC power outputted from a photovoltaic module into AC power, the solar energy generation system having an adaptive maximum power point tracking function, the solar energy generation system including: a minimum maintenance voltage determination unit configured to output a minimum maintenance voltage which enables the inverter to maintain an operation thereof corresponding to a grid voltage of the grid; a maximum power point tracking controller configured to determine a maximum power point tracking voltage at a maximum power point of the photovoltaic module, using the minimum maintenance voltage and an output voltage and output current of the photovoltaic module, and to output a reference voltage to track the maximum power point; a voltage calculator configured to calculate a difference between the reference voltage and the output voltage of the photovoltaic module; and a voltage adjuster configured to generate a reference current value using an output of the voltage calculator.

Preferably, when the output voltage of the photovoltaic module arrives at a minimum point voltage in a rated maximum power point range of the inverter, the maximum power point tracking voltage is equal to or higher than the minimum maintenance voltage, and the grid voltage is lower than a maximum allowable grid voltage, the maximum power point tracking controller replaces the minimum maintenance voltage with the minimum point voltage in the rated maximum power point range.

Preferably, when the output voltage of the photovoltaic module arrives at a minimum point voltage in a rated maximum power point range of the inverter, and the grid voltage is higher than the maximum power point tracking voltage which has been determined, the maximum power point tracking controller stops a maximum power point tracking function, and outputs the reference voltage so that the inverter outputs a voltage corresponding to the grid voltage.

In addition, according to another aspect of the present invention, there is provided a solar energy generation system having an adaptive maximum power point tracking function, the solar energy generation system including: a maximum power point tracking means for controlling an inverter so that an output voltage of a photovoltaic module tracks a maximum power point; and an inverter driving maintenance means for controlling the inverter to output power corresponding to a grid voltage when the output voltage of the photovoltaic module is lower than a minimum point in a rated maximum power point range of the inverter.

In addition, according to still another aspect of the present invention, there is provided an adaptive maximum power point tracking method of a solar energy generation system which is connected with a grid using an inverter for converting DC power outputted from a photovoltaic module into AC power, the method including: a step of measuring an output voltage and output current of the photovoltaic module; a step of outputting a minimum maintenance voltage which enables the inverter to maintain an operation thereof corresponding to a grid voltage of the grid; a maximum power point tracking control step of determining a maximum power point tracking voltage at a maximum power point of the photovoltaic module through use of the minimum maintenance voltage and the output voltage and output current of the photovoltaic module, and outputting a reference voltage to track the maximum power point; a step of calculating a difference between the reference voltage and the output voltage of the photovoltaic module; and a step of generating a reference current value using an output of a voltage calculator.

Preferably, the maximum power point tracking control step includes the steps of: determining whether the output voltage of the photovoltaic module arrives at a minimum point voltage in a rated maximum power point range of the inverter; and replacing the minimum maintenance voltage with the minimum point voltage in the rated maximum power point range when the maximum power point tracking voltage is equal to or higher than the minimum maintenance voltage, and the grid voltage is lower than a maximum allowable grid voltage.

Preferably, the maximum power point tracking control step includes the steps of: determining whether the output voltage of the photovoltaic module arrives at a minimum point voltage in a rated maximum power point range of the inverter; and when the grid voltage is higher than the maximum power point tracking voltage which has been determined, stopping a maximum power point tracking function and outputting the reference voltage so that the inverter outputs a voltage corresponding to the grid voltage.

BRIEF DESCRIPTION OF THE DRAWINGS

The above objects, and other features and advantages of the present invention will become more apparent after a reading of the following detailed description taken in conjunction with the drawings, in which.

DETAILED DESCRIPTION OF PREFERRED EMBODIMENTS

Figure 1:
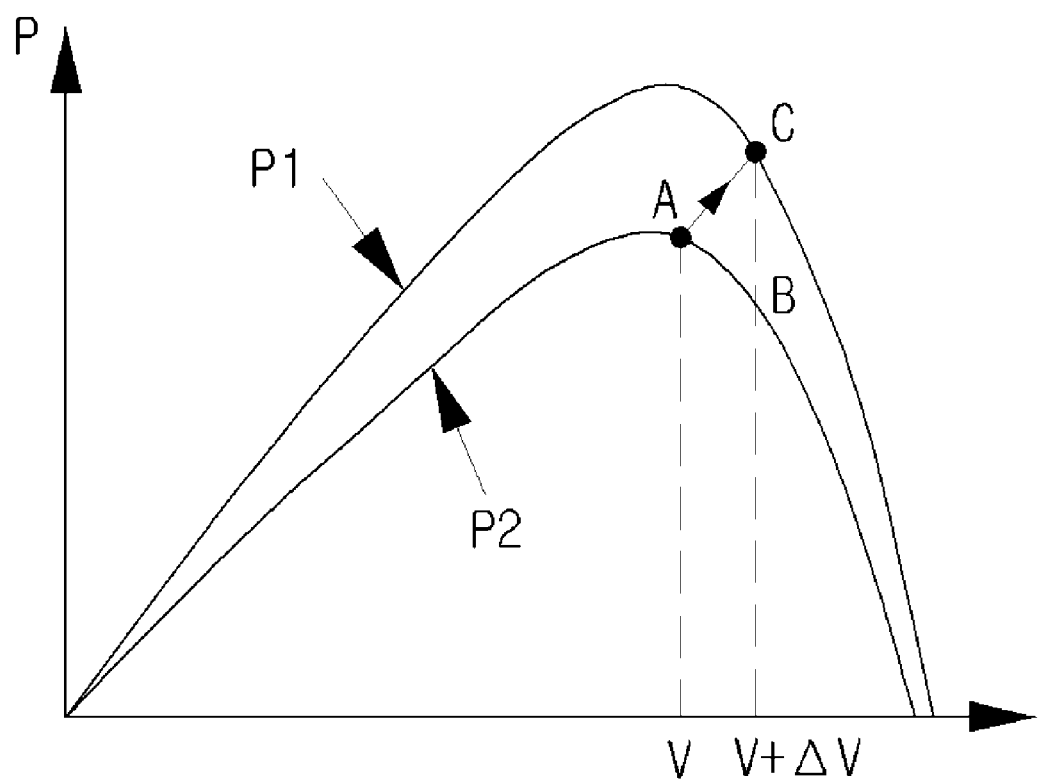
FIG. 1 is a view illustrating the P-V characteristic curves of a photovoltaic module according to a variation in the amount of solar radiation.
Figure 2:
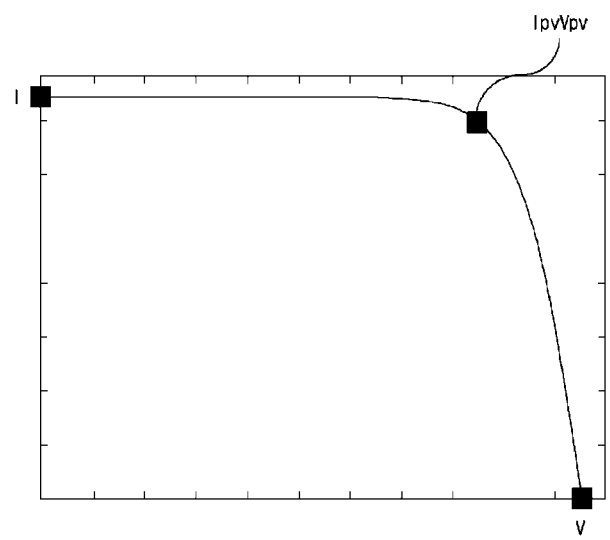
FIG. 2 is a view illustrating the I-V characteristic curve of a photovoltaic module.
Figure 3:
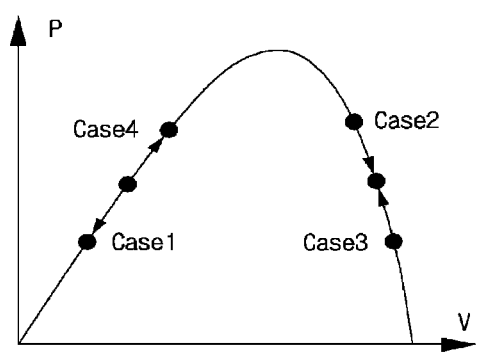
FIG. 3 is a view explaining an MPPT using P&O method.

As the invention allows for various changes and numerous embodiments, certain embodiments will be illustrated in the drawings and described in detail in the written description. However, this is not intended to limit the present invention to particular modes of practice, and it is to be appreciated that all changes, equivalents, and substitutes that do not depart from the ideas and technical scope of the present invention are encompassed in the present invention.

While such terms as "first" and "second," etc., may be used to describe various components, such components may not be limited to the above terms. The above terms are used only to distinguish one component from another.

For example, the first component may be called the second component without departing from the scope of the present invention. Likewise, the second component may be called the first component.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc. are intended to indicate the existence of the features, numbers, steps, operations, components, parts, or combinations thereof disclosed in the specification, and are not intended to preclude the possibility that one or more other features, numbers, steps, operations, components, parts, or combinations thereof may exist or may be added.

Hereinafter, a solar energy generation system having an adaptive maximum power point tracking function and a method thereof according to an embodiment of the present invention will be described in detail with referent to the accompanying drawings. Those components that are the same or are in correspondence are rendered the same reference numeral regardless of the figure number, and redundant descriptions are omitted.

Figure 4:
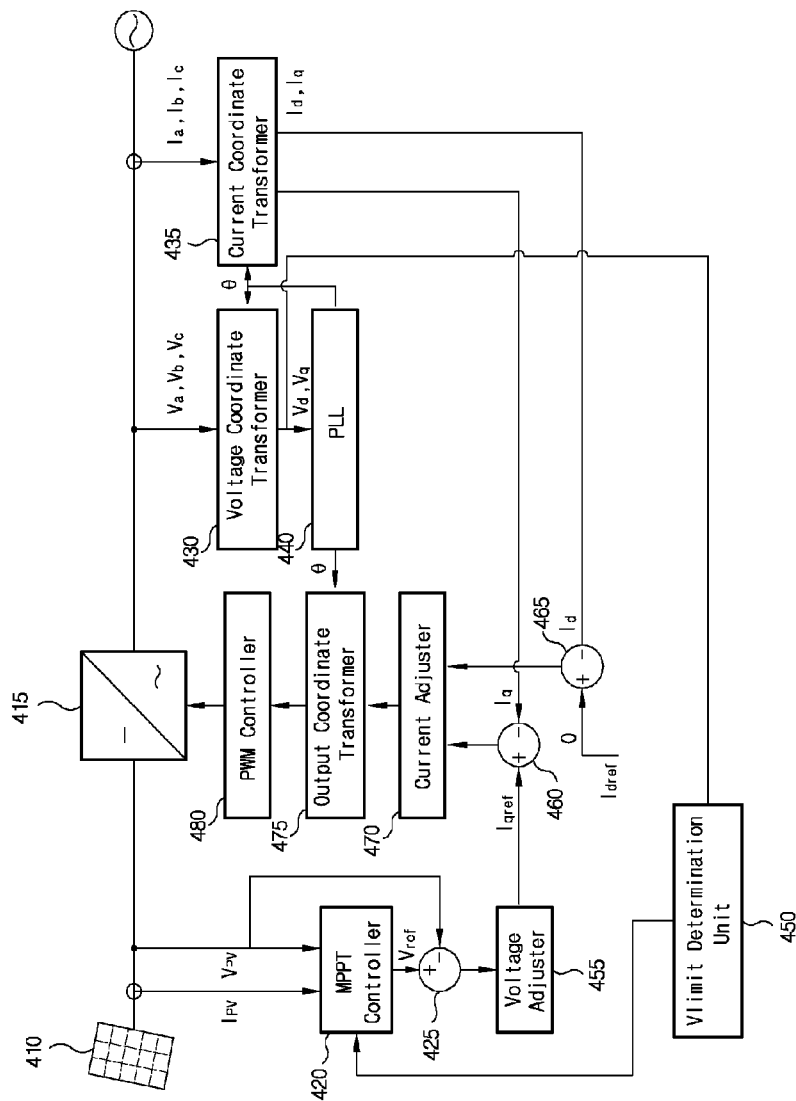
FIG. 4 is a block circuit diagram illustrating the configuration of a solar energy generation system according to an embodiment of the present invention.

FIG. 4 is a block circuit diagram illustrating the configuration of a solar energy generation system according to an embodiment of the present invention.

Referring to FIG. 4, the solar energy generation system according to an embodiment of the present invention includes a photovoltaic module 410, an inverter 415, a maximum power point tracking controller 420, a voltage calculator 425, a voltage coordinate transformer 430, a current coordinate transformer 435, a phase locked loop (PLL) 440, a minimum maintenance voltage determination unit 450, a voltage adjuster 455, a current amplitude calculator 460, a current phase calculator 465, a current adjuster 470, an output coordinate transformer 475, and a PWM controller 480.

The photovoltaic module 410 has a structure in which solar cells are connected in the longitudinal and transverse directions, and generates electrical energy through the photoelectric effect according to incident solar energy.

The inverter 415 converts direct current (DC) power supplied from the photovoltaic module 410 into alternating current (AC) power. According to an embodiment of the present invention, a 3-phase inverter is used to convert a DC voltage into a 3-phase AC voltage.

The voltage coordinate transformer 430 transforms a 3-phase voltage signal (Va, Vb, Vc), which has been received from an output terminal of the inverter 415, into a voltage signal (Vd, Vq) in a rotating coordinate system (D, Q), via a transformation into a voltage signal (Vα, Vβ) in a 2-phase stationary coordinate system (α, β).

In order to transform a voltage signal (Vα, Vβ) in the 2-phase stationary coordinate system into a voltage signal (Vd, Vq) in the rotating coordinate system, the voltage coordinate transformer 430 receives a phase angle θ from the PLL 440.

The current coordinate transformer 435 transforms a 3-phase current signal (Ia, Ib, Ic), which has been received from an output terminal of the inverter 415, into a current signal (Id, Iq) in the rotating coordinate system (D, Q), via a transformation into a current signal (Iα, Iβ) in the 2-phase stationary coordinate system (α, β).

In order to transform a current signal (Iα, Iβ) in the 2-phase stationary coordinate system into a current signal (Id, Iq) in the rotating coordinate system, the current coordinate transformer 435 receives a phase angle θ from the phase locked loop (PLL) 440.

The phase locked loop 440 receives the output (Vd, Vq) of the voltage coordinate transformer 430, and calculates the phase and frequency of the output of the inverter.

The minimum maintenance voltage determination unit 450 outputs a minimum maintenance voltage corresponding to the output voltage (grid voltage) of the inverter.

The maximum power point tracking controller 420 receives voltage Vpv and current Ipv which are outputted from the photovoltaic module, and outputs a reference voltage Vref to track the maximum power point of the photovoltaic module, using the received voltage Vpv and current Ipv and the minimum maintenance voltage outputted from the minimum maintenance voltage determination unit 450.

Meanwhile, in the prior art, when the output voltage of a photovoltaic module is lower than 450 V, which is the minimum point voltage $V_{lower,\ raged\ MPP}$ in the rated maximum power point range (MPP range; e.g. a range of 450 to 830 V) of an inverter, the operation of the inverter is stopped without consideration of the current grid voltage. However, according to an embodiment of the present invention, when the output voltage of the photovoltaic module is lower than 450 V, which is the minimum point voltage $V_{lower,\ raged\ MPP}$ in the rated maximum power point range the inverter, it is possible to extend the operation of the inverter 415 by taking the current grid voltage into consideration.

That is to say, in a state in which the output voltage of the photovoltaic module is lower than 450 V, which is the lowest voltage (i.e. the minimum point voltage; $V_{lower,\ raged\ MPP}$) in the rated maximum power point range the inverter, and in which the grid voltage $V_{grid}$ is lower than 110% of a rated voltage Vrated, when the maximum power point tracking voltage $V_{MPPT}$ is equal to or higher than the minimum maintenance voltage $V_{limit}$, and a grid voltage $V_{grid}$ is lower than the maximum allowable grid voltage, the maximum power point tracking controller 420 according to the present invention changes the minimum point voltage of the rated maximum power point range of the inverter with the minimum maintenance voltage, and performs a maximum power point tracking function, so that it is possible to extend the operation of the inverter 415.

The voltage calculator 425 subtracts the DC voltage Vpv, which is outputted from the photovoltaic module, from the reference voltage Vref outputted from the maximum power point tracking controller 420, and thus outputs a voltage calculation value Vref−Vpv.

The voltage adjuster 455 receives the voltage calculation value Vref−Vpv outputted from the voltage calculator 425, and then generates and outputs a current amplitude reference value Iqref to the current amplitude calculator 460.

The current amplitude calculator 460 subtracts the amplitude component Iq of the output current of the inverter, which is outputted from the current coordinate transformer 435, from the current amplitude reference value Iqref outputted from the voltage adjuster 455, and thus outputs a current amplitude calculation value Iqref−Iq.

The current phase calculator 465 substrates the phase component Id of the output current of the inverter, which is outputted from the current coordinate transformer 435, from a current phase component reference value Idref (Idref=0), and thus outputs a current phase calculation value Idref−Id.

The current adjuster 470 receives the current amplitude calculation value Iqref−Iq outputted from the current amplitude calculator 460 and the current phase calculation value Idref−Id outputted from the current phase calculator 465, and generates a current adjustment signal. Since the received values are DC values in the rotating coordinate system, the current adjuster 470 can generate a current adjustment signal using a proportional integral (PI) controller.

Since the current adjustment signal generated by the current adjuster 470 corresponds to a DC component in the rotating coordinate system, the output coordinate transformer 475 transforms the current adjustment signal in the rotating coordinate system into a current adjustment signal in the stationary coordinate system, and outputs the current adjustment signal in the stationary coordinate system. Specifically, using the phase angle θ outputted from the phase locked loop 440, the output coordinate transformer 475 transforms the current adjustment signal in the rotating coordinate system, which is outputted from the current adjuster 470, into the current adjustment signal in the stationary coordinate system.

The PWM controller 480 outputs a PWM control signal to control the output current of the inverter, using the current adjustment signal in the stationary coordinate system outputted from the output coordinate transformer 475. The PWM control signal is applied to the inverter, so that the output current of the inverter is adjusted.

Figure 5:
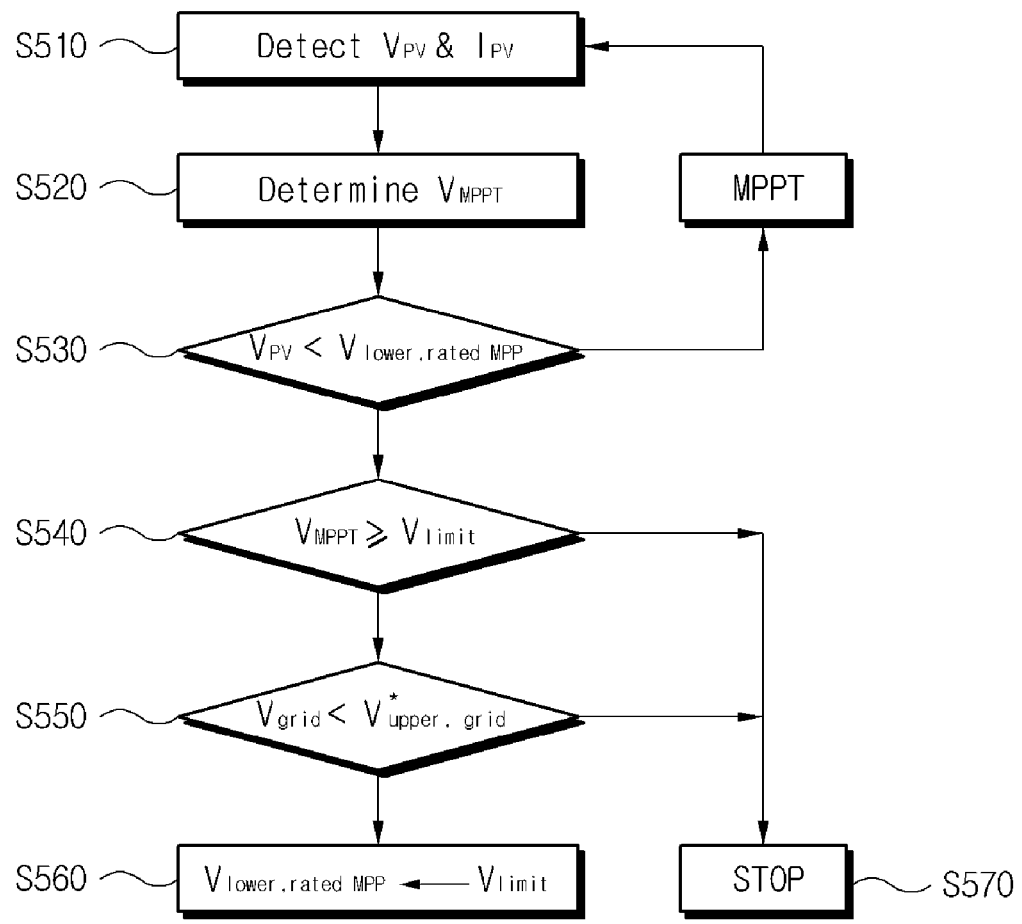
FIG. 5 is a flowchart illustrating an adaptive maximum power point control according to an embodiment of the present invention.
Figure 6:
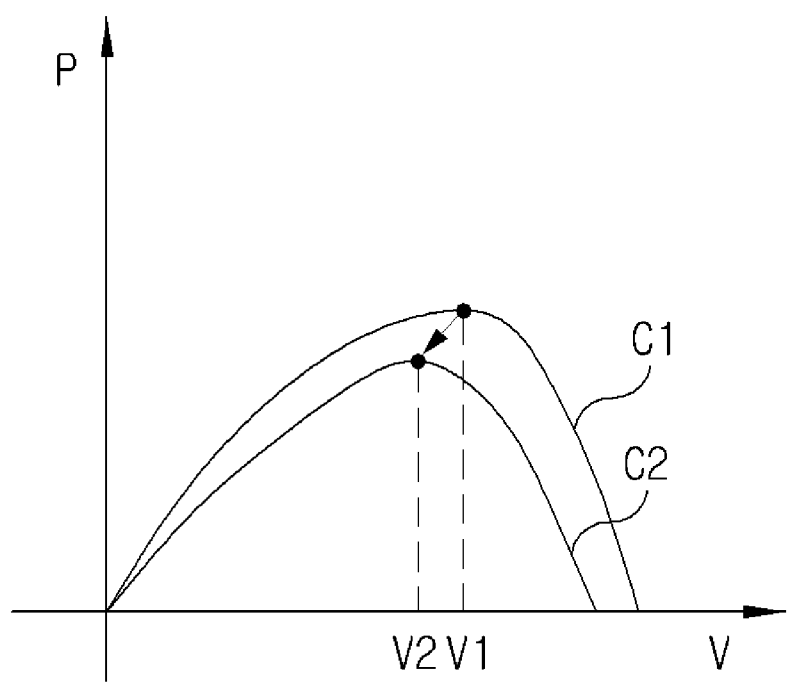
FIG. 6 is a view of P-V characteristic curves explaining the adaptive maximum power point control according to an embodiment of the present invention.

FIG. 5 is a flowchart illustrating an adaptive maximum power point control according to an embodiment of the present invention, and FIG. 6 is a view of P-V characteristic curves explaining the adaptive maximum power point control according to an embodiment of the present invention.

The voltage Vpv and current Ipv of a photovoltaic module, which are outputted from the photovoltaic module, are detected in step S510, and then the maximum power point tracking voltage $V_{MPPT}$ at the maximum power point is determined using the detected voltage Vpv and current Ipv of the photovoltaic module in step S520.

Until the output voltage Vpv of the photovoltaic module arrives at the minimum point voltage $V_{lower, rated MPPP}$ (i.e. V1 in characteristic curve C1) in a rated maximum power point range (e.g. 450 to 830 V) of the inverter, the maximum power point tracking (MPPT) function is performed.

During the performance of the MPPT function, when the output voltage Vpv of the photovoltaic module is lower than the minimum point voltage $V_{lower, raged MPP}$ (e.g. 450V) in the rated maximum power point range (e.g. 450 to 830 V) of the inverter in step S530, the maximum power point tracking voltage $V_{MPPT}$ is equal to or higher than the minimum maintenance voltage $V_{limit}$, required for maintaining the operation of the inverter in step S540, and a measured grid voltage $V_{grid}$ is lower than a maximum allowable grid voltage $V_{upper,grid}*$ (e.g. 110% of a rated voltage) in step S550, the minimum point voltage $V_{lower, rated MPP}$ of the rated maximum power point range is changed from the existing minimum voltage V1 to a minimum maintenance voltage $V_{limit}$ (e.g. V2 in characteristic curve C2) in step S560. In contrast, when the maximum power point tracking voltage $V_{MPPT}$ is lower than the minimum maintenance voltage $V_{limit}$, or when a measured grid voltage $V_{grid}$ corresponds to a maximum allowable grid voltage $V_{upper,grid}*$, the operation of the inverter is stopped.

In addition, according to another embodiment of the present invention, steps S540 and S550 may be switched in order or may be performed at the same time.

Meanwhile, in a solar energy generation system, when a grid voltage corresponding to 110% of a rated voltage, which is the maximum allowable grad voltage, is outputted, an inverter operates to perform a maximum power point tracking function. In addition, when a grid voltage exceeds 110% of a rated voltage, the he convention inverter cannot track the maximum power point (MPP) and thus the operation thereof is stopped.

However, according to another embodiment of the present invention, when an output voltage arrives at the minimum point in a rated maximum power point range, and the minimum maintenance voltage $V_{limit}$ outputted from the minimum maintenance voltage determination unit 450 exceeds 110% of a raged voltage, the maximum power point tracking controller 420 abandons the maximum power point tracking function, and increases the output voltage according to a P-V characteristic curve while controlling output power to be reduced, so that it is possible to extend the operation of the inverter 415.

Figure 7:
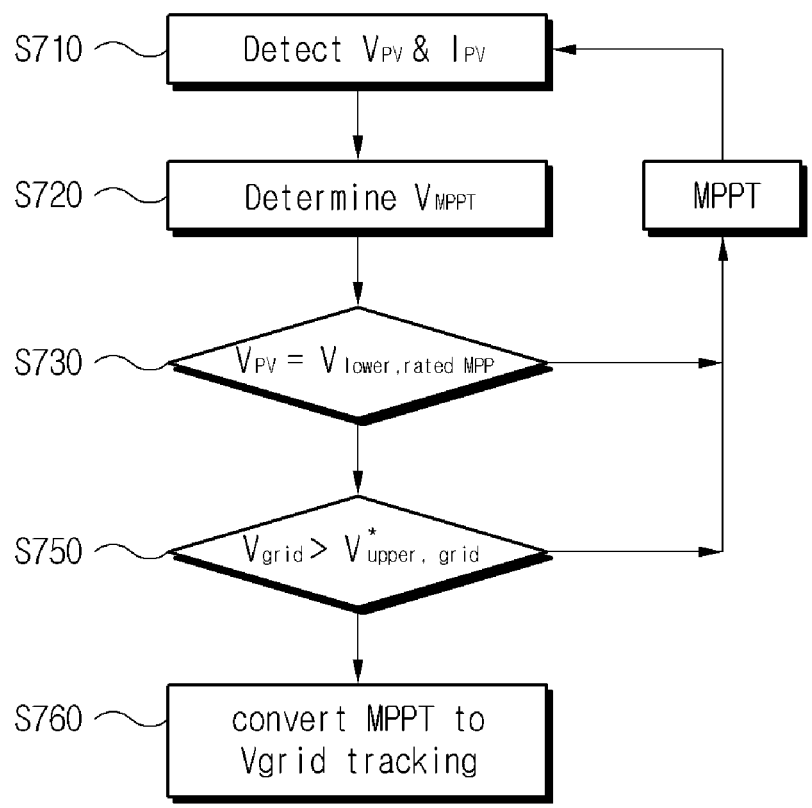
FIG. 7 is a flowchart illustrating an adaptive maximum power point control according to another embodiment of the present invention.
Figure 8:
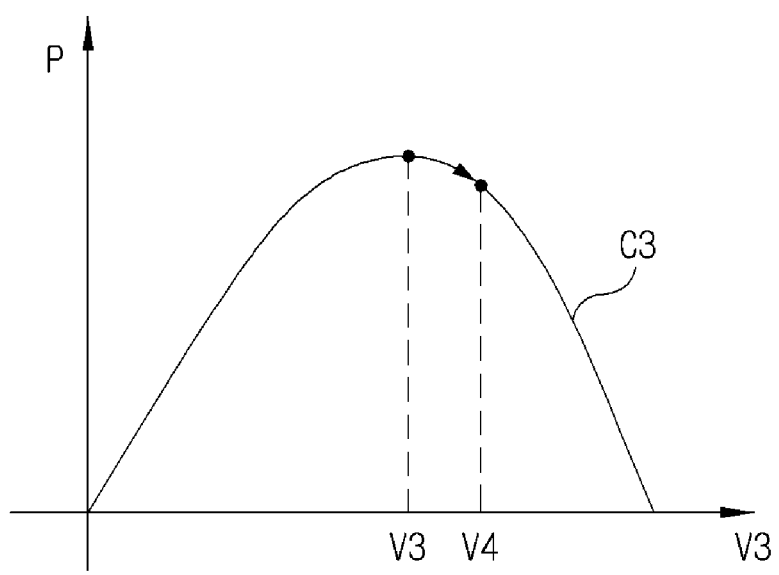
FIG. 8 is a view of P-V characteristic curve explaining the adaptive maximum power point control according to another embodiment of the present invention.

FIG. 7 is a flowchart illustrating an adaptive maximum power point control according to another embodiment of the present invention, and FIG. 8 is a view of a P-V characteristic curve explaining the adaptive maximum power point control according to another embodiment of the present invention.

The voltage Vpv and current Ipv of a photovoltaic module, which are outputted from the photovoltaic module, are detected in step S710, and then the maximum power point tracking voltage $V_{MPPT}$ at the maximum power point is determined using the detected voltage Vpv and current Ipv of the photovoltaic module in step S720.

It is determined whether or not the output voltage Vpv of the photovoltaic module arrives at the minimum point $V_{lower, rated MPP}$ (e.g. V3 in characteristic curve C3) in a rated maximum power point range of the inverter in step S730. When a measured grid voltage $V_{grid}$ is higher than a determined maximum power point tracking voltage, e.g. V4, in step S750, the maximum power point tracking function is stopped, and a reference voltage Vref is controlled such that a voltage corresponding to the grid voltage $V_{grid}$ measured by the inverter can be outputted in step S760.

As is apparent from the above description, the present invention provides a solar energy generation system in which, although the output voltage of the photovoltaic module is in an unstable state, when power of a predetermined level or more can be outputted, it is possible to prevent frequent repetition of operation and stoppage of the inverter by changing the maximum power point of the photovoltaic module, which makes it possible to increase the efficiency of the inverter and the quality of power and to implement a reliable solar energy generation system. In addition, this contributes to improving the energy efficiency.

Although preferred embodiments of the present invention has been described for illustrative purposes, those skilled in the art will appreciate that various modifications, additions and substitutions are possible, without departing from the scope and the spirit of the invention as disclosed in the accompanying claims. Accordingly, the scope of the invention is not to be limited by the above embodiments but by the claims and the equivalents thereof.

What is claimed is:

1. A solar energy generation system connected to a grid using an inverter for converting DC power outputted from a photovoltaic module into AC power and having an adaptive maximum power point tracking function, the solar energy generation system comprising:
   a minimum maintenance voltage determination unit outputting a minimum maintenance voltage which enables the inverter to maintain an operation thereof corresponding to a grid voltage of the grid;
   a maximum power point tracking controller determining a maximum power point tracking voltage at a maximum power point of the photovoltaic module using the minimum maintenance voltage and an output voltage and output current of the photovoltaic module, and outputting a reference voltage to track the maximum power point;

a voltage calculator calculating a difference between the reference voltage and the output voltage of the photovoltaic module; and a voltage adjuster generating a reference current value using an output of the voltage calculator, wherein, when the output voltage of the photovoltaic module arrives at a minimum point voltage in a rated maximum power point range of the inverter, the maximum power point tracking voltage is equal to or higher than the minimum maintenance voltage, and the grid voltage is lower than a maximum allowable grid voltage, the maximum power point tracking controller replaces the minimum maintenance voltage with the minimum point voltage in the rated maximum power point range.

2. A solar energy generation system connected to a grid using an inverter for converting DC power outputted from a photovoltaic module into AC power and having an adaptive maximum power point tracking function, the solar energy generation system comprising:

a minimum maintenance voltage determination unit outputting a minimum maintenance voltage which enables the inverter to maintain an operation thereof corresponding to a grid voltage of the grid;

a maximum power point tracking controller configured to determine a maximum power point tracking voltage at a maximum power point of the photovoltaic module using the minimum maintenance voltage and an output voltage and output current of the photovoltaic module, and outputting a reference voltage to track the maximum power point;

a voltage calculator calculating a difference between the reference voltage and the output voltage of the photovoltaic module; and a voltage adjuster generating a reference current value using an output of the voltage calculator, wherein, when the output voltage of the photovoltaic module arrives at a minimum point voltage in a rated maximum power point range of the inverter, and the grid voltage is higher than the maximum power point tracking voltage which has been determined, the maximum power point tracking controller stops a maximum power point tracking function, and outputs the reference voltage so that the inverter outputs a voltage corresponding to the grid voltage.

3. An adaptive maximum power point tracking method of a solar energy generation system connected to a grid using an inverter for converting DC power outputted from a photovoltaic module into AC power, the method comprising:

a step of measuring an output voltage and output current of the photovoltaic module;

a step of outputting a minimum maintenance voltage which enables the inverter to maintain an operation thereof corresponding to a grid voltage of the grid;

a maximum power point tracking control step of determining a maximum power point tracking voltage at a maximum power point of the photovoltaic module through use of the minimum maintenance voltage and the output voltage and output current of the photovoltaic module, and outputting a reference voltage to track the maximum power point;

a step of calculating a difference between the reference voltage and the output voltage of the photovoltaic module; and a step of generating a reference current value using an output of a voltage calculator, wherein the maximum power point tracking control step comprises the steps of determining whether the output voltage of the photovoltaic module arrives at a minimum point voltage in a rated maximum power point range of the inverter, and replacing the minimum maintenance voltage with the minimum point voltage in the rated maximum power point range when the maximum power point tracking voltage is equal to or higher than the minimum maintenance voltage, and the grid voltage is lower than a maximum allowable grid voltage.

4. An adaptive maximum power point tracking method of a solar energy generation system connected to a grid using an inverter for converting DC power outputted from a photovoltaic module into AC power, the method comprising:

a step of measuring an output voltage and output current of the photovoltaic module;

a step of outputting a minimum maintenance voltage which enables the inverter to maintain an operation thereof corresponding to a grid voltage of the grid;

a maximum power point tracking control step of determining a maximum power point tracking voltage at a maximum power point of the photovoltaic module through use of the minimum maintenance voltage and the output voltage and output current of the photovoltaic module, and outputting a reference voltage to track the maximum power point;

a step of calculating a difference between the reference voltage and the output voltage of the photovoltaic module; and a step of generating a reference current value using an output of a voltage calculator, wherein the maximum power point tracking control step comprises the steps of determining whether the output voltage of the photovoltaic module arrives at a minimum point voltage in a rated maximum power point range of the inverter, and when the grid voltage is higher than the maximum power point tracking voltage which has been determined, stopping a maximum power point tracking function and outputting the reference voltage so that the inverter outputs a voltage corresponding to the grid voltage.

* * * * *